US006509740B1

(12) United States Patent
Needle et al.

(10) Patent No.: US 6,509,740 B1
(45) Date of Patent: Jan. 21, 2003

(54) METHODS AND APPARATUS FOR TIME DOMAIN REFLECTOMETRY

(75) Inventors: Dave Needle, Alameda, CA (US); Stan F. Shepard, Oakland, CA (US)

(73) Assignee: Jovial Test Equipment, Inc., Oakland, CA (US)

( * ) Notice: Subject to any disclaimer, the term of this patent is extended or adjusted under 35 U.S.C. 154(b) by 0 days.

(21) Appl. No.: 09/543,961

(22) Filed: Apr. 7, 2000

Related U.S. Application Data
(60) Provisional application No. 60/128,553, filed on Apr. 9, 1999.

(51) Int. Cl.⁷ ............................. G01R 31/11; G01R 31/08
(52) U.S. Cl. ............................................ 324/533; 324/535
(58) Field of Search ............................. 324/533, 527, 324/528, 529, 532, 534, 642, 644, 535; 342/22

(56) References Cited

U.S. PATENT DOCUMENTS

| | | |
|---|---|---|
| 4,459,437 A | 7/1984 | Gabry et al. |
| 4,739,276 A | 4/1988 | Graube |
| 4,755,742 A | 7/1988 | Agoston et al. |
| 5,319,311 A | 6/1994 | Kawashima et al. |
| 5,521,512 A | 5/1996 | Hulina |
| 5,608,328 A * | 3/1997 | Sanderson .................. 324/529 |
| 6,026,145 A | 2/2000 | Bauer et al. |

* cited by examiner

Primary Examiner—N. Le
Assistant Examiner—James Kerveros
(74) Attorney, Agent, or Firm—Allen, Dyer, Doppelt, Milbrath & Gilchrist, P.A.

(57) ABSTRACT

Methods and apparatus for determining the location of a fault or another region of interest in an electrical conductor such as an electrical cable. A preselected electrical signal is applied to the electrical conductor and a reflected signal produced thereby is generated. The reflected signal is compared to a plurality of preselected voltage values and time values are recorded representing times at which the voltage of the reflected signal crosses the preselected voltage values. Mathematical algorithms are applied using the recorded time and voltage values first to locate a suspected knee region in the reflected signal, then to confirm the presence of the knee within the suspected knee region. The location of the knee in the reflected signal is then used to calculate the distance to the fault or other region of interest. A further series of time values is recorded within the suspected knee region and used to more precisely determine the true location of the knee in the reflected signal.

21 Claims, 8 Drawing Sheets

TDR DEVICE COUPLED TO MEASUREMENT DEVICE. CABLE UNDER TEST IS 2 LENGTHS OF 12 GAUGE AC WIRE JOINED BY A PAIR OF WIRE CONNECTORS.

TDR WAVEFORM AT MEASUREMENT POINT OF FIG. 7, SHORTING BAR IS NOT CONNECTED

SIMPLE TDR DEVICE

TDR WAVEFORM AT MEASUREMENT POINT OF FIG. 1

TDR SYSTEM DRIVING TYPICAL AC WIRING CIRCUIT

TDR WAVEFORM AT MEASUREMENT POINT OF FIG. 3

TDR SYSTEM DRIVING TYPICAL CABLE TV COAX CIRCUIT

TDR WAVEFORM AT MEASUREMENT POINT OF FIG. 5

TDR WAVEFORM AT MEASUREMENT POINT OF FIG. 7, SHORTING BAR IS NOT CONNECTED

TDR WAVEFORM AT MEASUREMENT POINT OF FIG. 7, SHORTING BAR IS CONNECTED

TDR WAVEFORM AT MEASUREMENT POINT OF FIG. 7

TDR WAVEFORM AT MEASUREMENT POINT OF FIG. 7, SHOWING KNEE TEST

METHODS AND APPARATUS FOR TIME DOMAIN REFLECTOMETRY

CLAIM OF PRIORITY

This application claims priority on U.S. Provisional Patent Application Serial No. 60/128,553, filed on Apr. 9, 1999.

BACKGROUND OF THE INVENTION

The invention relates to the diagnosis and location of faults or other conditions of interest in electrical conductors such as electrical wiring or cables. More particularly, the invention provides methods and apparatus for time domain reflectometry according to which a fault or another region of interest may be located in an electrical conductor.

A time domain reflectometer (TDR) is a device (see FIG. 1) that generates an initial electrical signal, couples that signal to a pair of conductors through a drive impedance ZD, and observes the electrical waveform at that coupling point. That observed waveform is comprised of an amount of the initial signal and an amount of each signal, if any, that is reflected back from any non-uniformity in the impedance of the conductor pair. In this discussion, that observed electrical waveform is called the "TDR waveform". The relative amplitudes of the initial signal and the reflected signals are dependent on the relative impedances at each of the signal origination points and the drive impedance. V2 in FIG. 2 represents the voltage amplitude of the initial electrical signal. V1 in FIG. 2 represents the voltage amplitude in the TDR waveform between the time of the start of the initial electrical signal and the time of the reflection from the far end of the cable under test. This voltage is calculated by the formula $V1=V2*(ZC/(ZC+ZD))$. The elapsed time (T) between the observation of the initial signal and the observation of the reflections is dependent on the physical distance (D) between those signal points and the velocity of propagation (VOP) for the conductor pair. This VOP is usually between ½ and 1 times the speed of light in a vacuum. Since the signal travels from the coupling point to the reflection point and then back, the elapsed time is equal to twice the physical distance divided by the velocity of propagation: $T=2*D/VOP$. In this discussion, T ($=2*D/VOP$) is called the "electrical length". One of the common uses of the TDR technique is to determine the distance between the point of connection and a fault in a cable. The fault (shorted wires, broken wire, electrical leakage due to moisture, crushed dielectric, etc.) usually manifests itself as a non-uniformity in the impedance at the point of the fault and is thus observed as a reflected signal. The distance is calculated by the formula $D=VOP*T/2$. The time is measured from the start of the initial electrical signal (T1) to the start of the change in voltage from V1 to V2, as shown in FIG. 2. This start in the change of the voltage is referred to as the "Knee".

These TDR measurements require at least two conductive parts in the measurement path. One is the conductor being measured, and the other represents the conductive environment around the first conductor. This environment can be the second wire in a twisted pair, the shield around a center conductor of a coaxial cable, the multitude of wires in a wire or cable bundle, the metal conduit in which a single wire or multiple wires are located, or the dirt and the earth in which a wire is buried. The reference in this discussion to "wire pair" or "cable" means any wire and its conductive environment. The initial electrical signal used in TDR measurements can be of any shape, but the common shapes used are a narrow pulse or a steep step.

When the cable is relatively noise free, and consists of just one cable with no splices or impedance variations such as those caused by crushed dielectric, the TDR waveform is easily measured (FIG. 2) and interpreted. The major element of this waveform is the reflection from the end of the cable and the electrical length to that end can easily be measured with common TDR timing techniques. However, if the cable under test is actually constructed of two or more cables with one or more splices, the TDR waveform will contain elements of those splices and impedance variations due to cable differences, and will be difficult to interpret. Some elements of the waveform will be indicative of normal conditions in the cable and its installation, and some will be indicative of a cable or connector failure. For example, a normal household AC wiring situation could contain 12 gauge wire from the circuit breaker to a switch, and then only 16 gauge wire from the switch to an overhead light fixture (FIG. 3). The perturbations in the TDR waveform (FIG. 4) caused by the change in wire size, the spread of the individual conductors at the switch, and the switch itself, are significant in size when compared to actual failures in such a cable. These perturbations could, in the absence of adequate waveform analysis, be mistaken for flaws or failures in the cable. An additional example can be found in cable TV systems, where 75 ohm coaxial cables are joined together with small coaxial connectors (FIG. 5). The impedance variations in the cables and connectors cause perturbations in the TDR waveform (FIG. 6) that reach 25% of the normal signal amplitude. Such variations are, in the absence of adequate waveform analysis, indistinguishable from failures due to crushed dielectric or improperly attached connectors. In the normal use of a TDR-based cable fault measurement tool, the desired information is the distance to the fault, and not the locations of normally occurring splices and connectors. The portion of the TDR waveform that contains the information needed to determine the distance to the fault is the transition from a horizontal signal (small increase in voltage as time increases) to a vertical signal (large increase in voltage as time increases) and is called the 'knee' region (FIG. 2). There may be several knee regions in a TDR waveform, and detailed analysis is required to identify the real fault data in the midst of many fault-like data groups in the measurement.

The analysis of such multi-element TDR waveforms involves the measurement and storage of many data points along the waveform. A common method used for measuring the TDR waveform is to sample the voltage at regularly spaced time intervals and save the data in a memory (see, e.g., U.S. Pat. Nos. 5,521,512 and 4,755,742). These samples can later be analyzed by a software program or a trained human technician. The absolute time values involved in the TDR waveform are in the nanosecond and sub-nanosecond range, and the voltages involved range from tens of millivolts to several volts, requiring expensive components for the sampling portion of the hardware. Many thousands of samples are needed for a comprehensive analysis, and this requires expensive memory. The analysis software itself can be large and can require expensive processing in order to reach a valid conclusion in a reasonable period of time. For example, a 3000 foot cable (electrical length) sampled at 6 inch intervals would require 6000 samples. And, since the range of voltage to be sampled is greater than 200 to 1, at least an 8 bit sampling device is required. Using low cost hardware, these samples could take 100 microseconds ($\mu s$) each to acquire, and then take 250 microseconds ($\mu s$) each to analyze. This would result in a measurement time of over 2 seconds, with a storage requirement of 6000 bytes.

Another common method of detecting cable faults with TDR measurements is to select a voltage and observe the time at which the TDR waveform crosses that voltage (see, e. g, U.S. Pat. No. 4,739,276). Such a method requires that the initial signal generated by the TDR device is sufficiently sharp to avoid dispersion effects. Additionally, the user is expected to select or vary that voltage and interpret the time readings. The problem with such techniques is that in the absence of detailed wave shape analysis, a large but inconsequential impedance variation is easily mistaken for the fault.

As more homes and small businesses install more computer and communications systems, the need for very low cost and very easy to use wire and cable test equipment has grown. Manual analysis of the complex TDR waveform by the untrained electrician or TV installer is not reliable, and the cost of the existing automatic TDR analyzer products is too high for most of that same market. This invention addresses that need by providing for a method of measuring the TDR waveform and analyzing the data such that very low cost components can be used, a small number of measurements are required, and the analysis requires a very small amount of memory and processing time. This results in a fully automatic, low cost TDR cable fault detection product.

SUMMARY OF THE INVENTION

The invention provides methods and apparatus for using time domain reflectometry to determine the position of a fault or another location of interest in an elongated electrical conductor such as an electrical cable. In preferred embodiments of the invention, a predetermined electrical signal is applied to the electrical conductor at a selected location to produce a reflected signal in the conductor. The reflected signal is monitored and values are stored representing times at which the voltage of the reflected signal crosses a plurality of pre-selected voltage values. Mathematical analysis is then applied to the stored time values and the pre-selected voltage values to determine the time between the initial application of the electrical signal and the propagation of the applied signal to the fault or other location of interest. From this time of propagation; the distance from the application site to the location of interest may be calculated based on the known speed of propagation of the electrical signal within the conductor.

BRIEF DESCRIPTION OF THE DRAWINGS

The written description provided herein may be better understood with reference to the appended drawings, in which.

DESCRIPTION OF THE PREFERRED EMBODIMENTS

Figure 1:
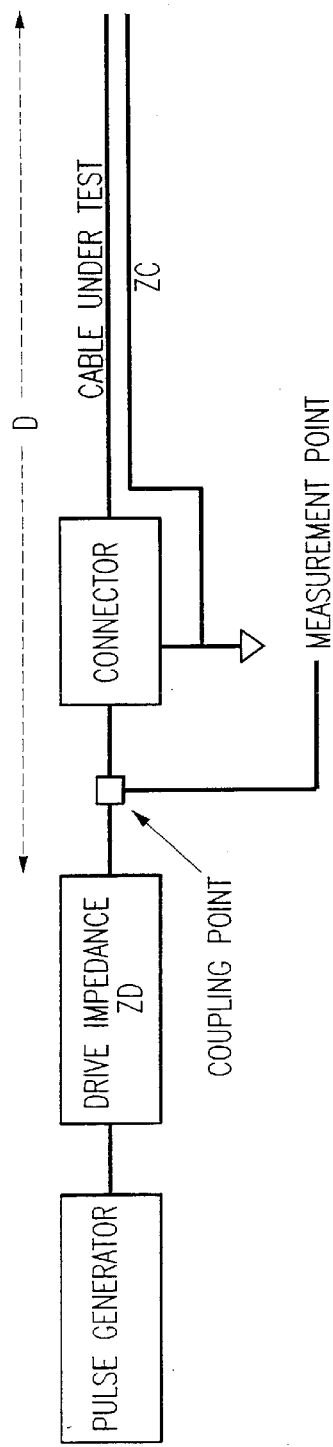
FIG. 1 is a simplified schematic depiction of a device for performing time domain reflectometry including the generation of an initial electrical signal and the observation of a reflected electrical signal in an electrical conductor.
Figure 2:
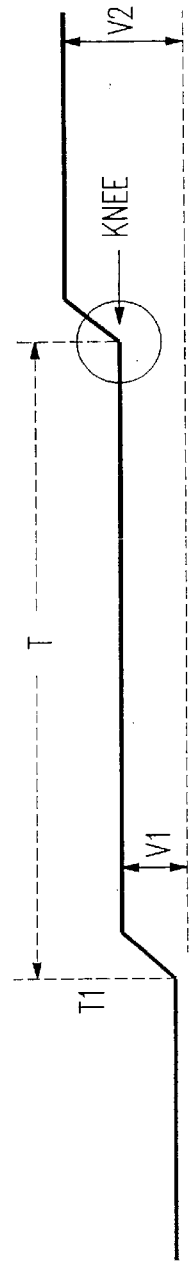
FIG. 2 is a idealized illustration of the observed signal in a simple electrical cable.
Figure 3:
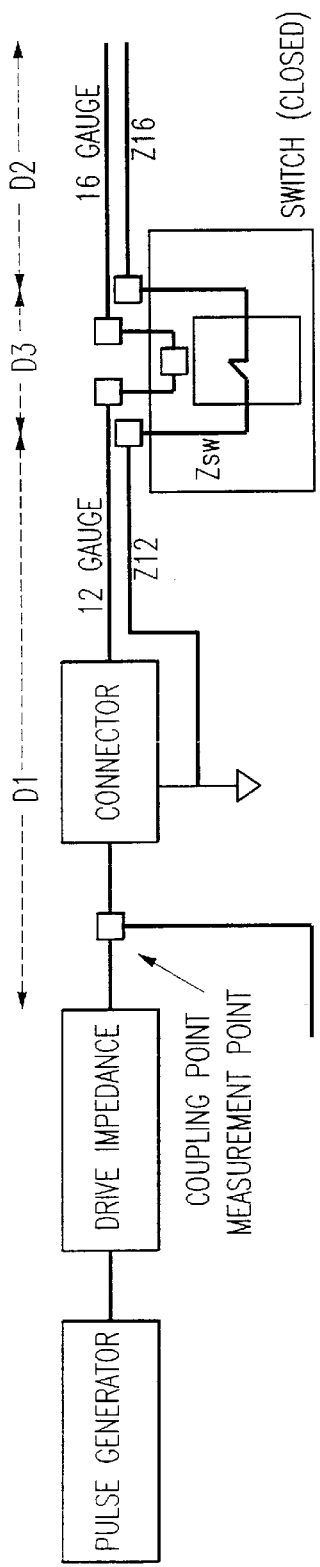
FIG. 3 is a schematic illustration of a time domain reflectometry system attached to an AC electrical wiring circuit.
Figure 4:
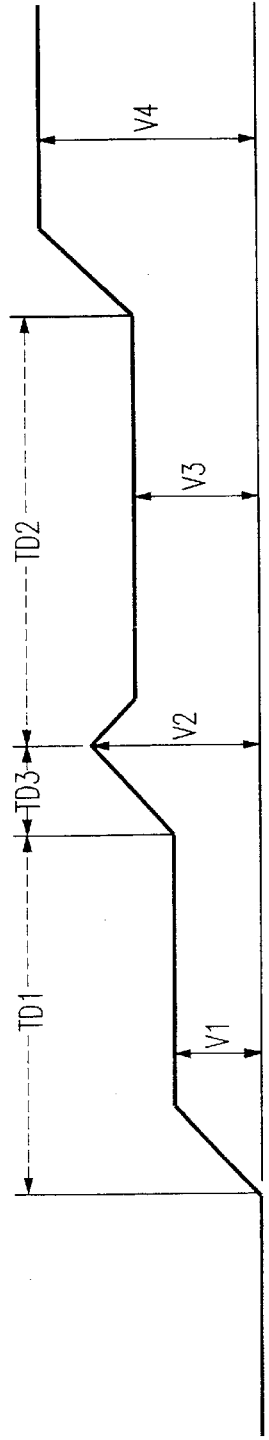
FIG. 4 illustrates the observed electrical signal in the circuit of FIG. 3.
Figure 5:
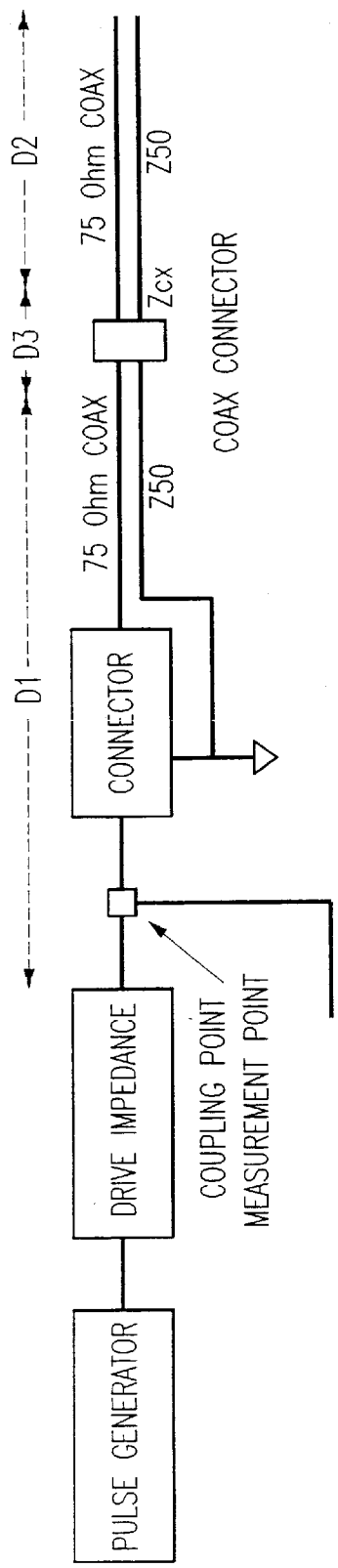
FIG. 5 depicts a time domain reflectometry system connected to a representative cable TV coaxial wiring circuit.
Figure 6:
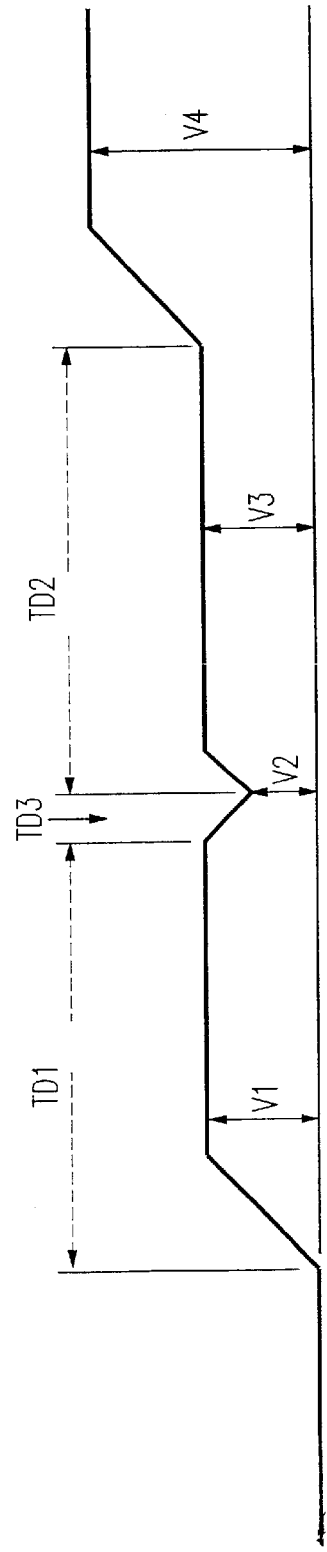
FIG. 6 illustrates the electrical signal observed in the circuit of FIG. 5.
Figure 7:
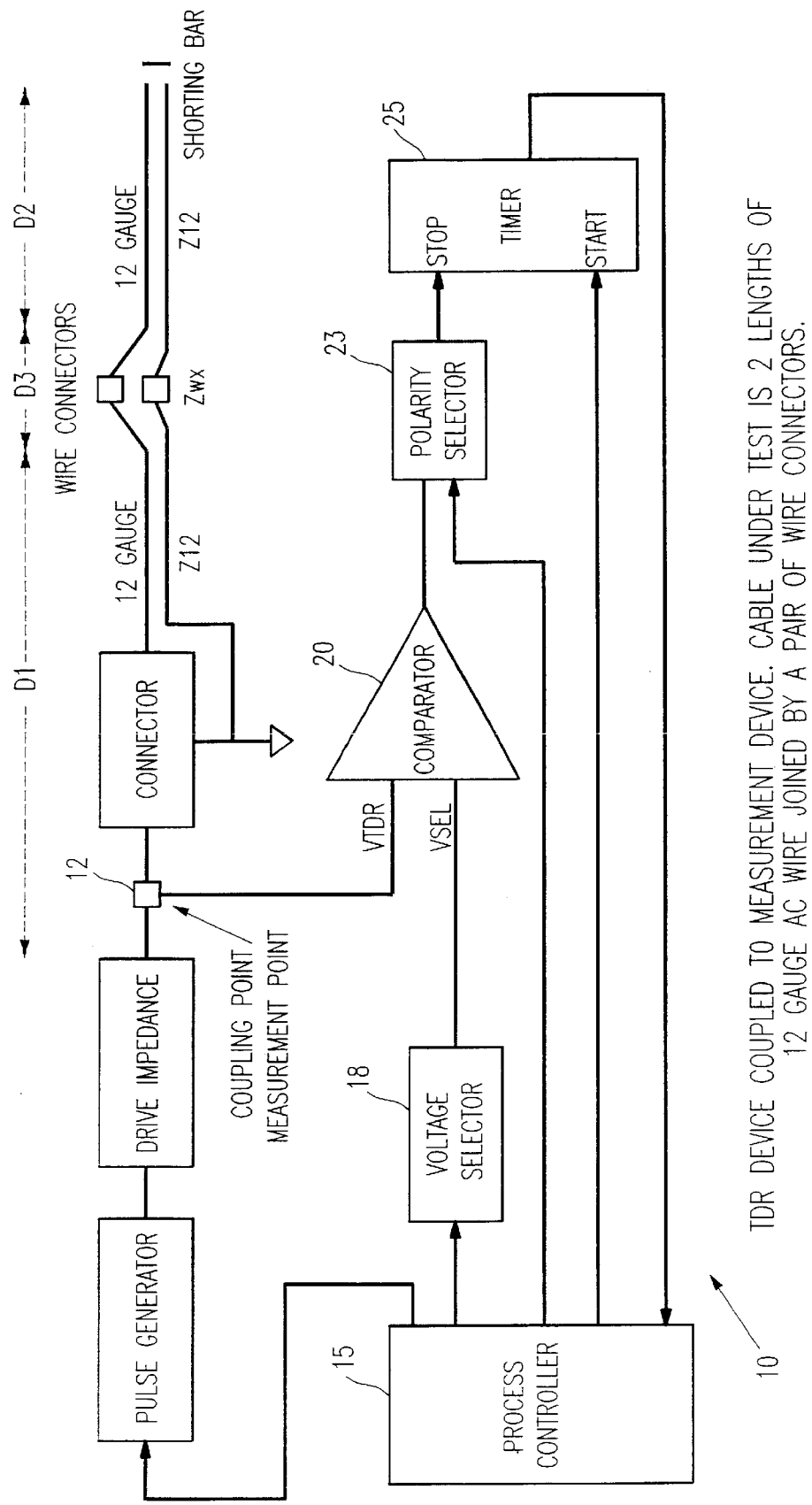
FIG. 7 is a simplified schematic diagram illustrating an embodiment of apparatus incorporating the invention attached to a representative household wiring circuit.

This invention provides for an apparatus and a method of automatically measuring a time domain reflectometry (TDR) waveform and automatically analyzing the measurement results with low cost components and a minimum of processing time. The measurements are made by selecting a voltage value and direction for comparison, and measuring the time at which the TDR waveform crosses that voltage value in the selected direction. Comparisons are then made between the time values from one measurement to the next. Since the measurements are made at varying voltage levels rather than varying times, the maximum number of measurements that could be made is equal to the resolution of the voltage selector (nominally 256 levels) * 2 (one measurement in each direction)=512. Note that the final results can be obtained without making the full maximum number of measurements. While these time vs voltage measurements do not provide all of the data that is contained in the normal voltage vs. time measurements, the unique analysis method of this invention extracts the desired information as the measurements are made, with minimal processing power and storage requirements of less than 20 bytes. FIG. 7 shows a system comprised of a simple TDR device 10 coupled at the measurement point 12 to the measurement device of this invention. A process controller 15 such as a microprocessor selects a voltage in a voltage selector 18 such as any ordinary DAC. That voltage is connected to one input of a comparator 20. The controller 15 also selects a direction for comparison using a selector 23 such as an ordinary exclusive OR gate. The output of the polarity selector is coupled to the "stop" input of a timer 25 that counts intervals of time that are relevant to the lengths of cable of interest. In our first implementation, these intervals are 15 ns. The controller then signals the timer to "start" and signals the pulse generator to issue its initial electrical signal.

Figure 8:
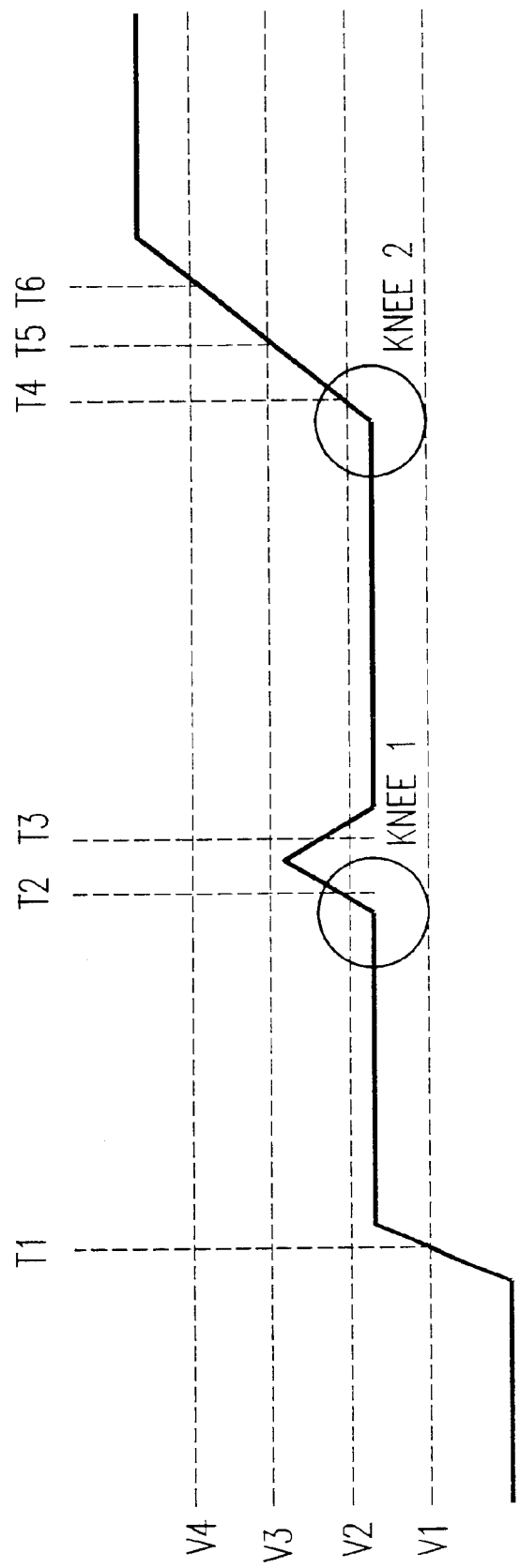
FIG. 8 illustrates an electrical signal observed in the circuit as depicted in FIG. 7.

When the voltage of the resultant TDR waveform at the measurement point passes the comparison voltage in the direction selected by the polarity selector, the timer is stopped. The time value of the timer is read by the controller for use by the analysis algorithm. In FIG. 8, with the positive direction selected for the crossing, four selected voltages are shown with their four respective time readings. V1 reads T1, V2 reads T2, V3 reads T5, and V4 reads T6. Note that some important details of the TDR waveform are hidden from the measurement. In FIG. 8, the time T4 is the reading most representative of knee 2, but it is not visible to the measurement device due to its being in the "shadow" of the edge at T2. While this problem can be overcome by using hardware to digitally delay the time reading mechanism until after time T2 has been reached, such hardware is costly and requires additional algorithms to determine actually how long to wait after the offending event. Additionally, in actual use, the noise on cables being tested would invoke many such time-skips, resulting in extending the time required to make the measurement, and may not reduce the error in determining the true position of the knee. This invention avoids the issue by continuing to make voltage-related time measurements and then interpolating the results to calculate the likely position of the knee. In FIG. 8, measurements are made at V3 and V4. The time delta of T6–T5 is calculated and subtracted from T5 to yield an approximate value for T4.

Prior to interpolating the readings to calculate the time of the knee, the determination of when these readings constitute a likely valid knee must first be made. The criterion used for distinguishing a real fault knee from a nominal perturbation knee in the waveform are the amplitude and slope of the knee region. Analysis of many cable types and situations has shown that the slope of the knee at a real fault or perturbation is larger than the slope of the waveform due to its natural characteristics of leakage and DC resistance. It is also shown that the amplitude of a real fault is larger than the amplitude of a perturbation. It is also shown that as the time from the start of the initial electrical signal to the time of the knee increases, the slope of the knee decreases. We have determined that for a valid knee to exist, the following conditions must be met (see FIG. 11):

1. The initial slope Vs/Ts must be at least ½ (0.5), where Vs is the height (V3–V2) of the measured portion of the waveform as a percentage of the initial electrical signal (V7), and Ts is the difference of the time readings measured at each of those voltages (T3–T2) as a percentage of the time from the start of the initial electrical signal to the time of the suspected knee (T2–T1).

2. The voltage amplitude (V5–V2) of the suspected knee must reach 4% of the initial electrical signal.

3. The extended slope ((V5–V2)/V7)/((T6–T2)/(T2–T1)) must be at least ⅙ (0.16).

For this disclosure, it is implied in all delta-voltage descriptions that they are expressed as a percentage of the initial electrical signal. It is also implied that in all delta-time descriptions that they are expressed as a percentage of the time to the first time reading of the delta. Thus the deltas in the above item number 3 can be expressed as (V5–V2) and (T6–T2).

In this implementation, we use 1/128 as the initial Vs and 3/256 as the initial Ts, giving an initial slope minimum of 0.6. The extended slope is calculated as 14/256 for V and 64/256 for T, giving a minimum of 0.21.

Figure 11:
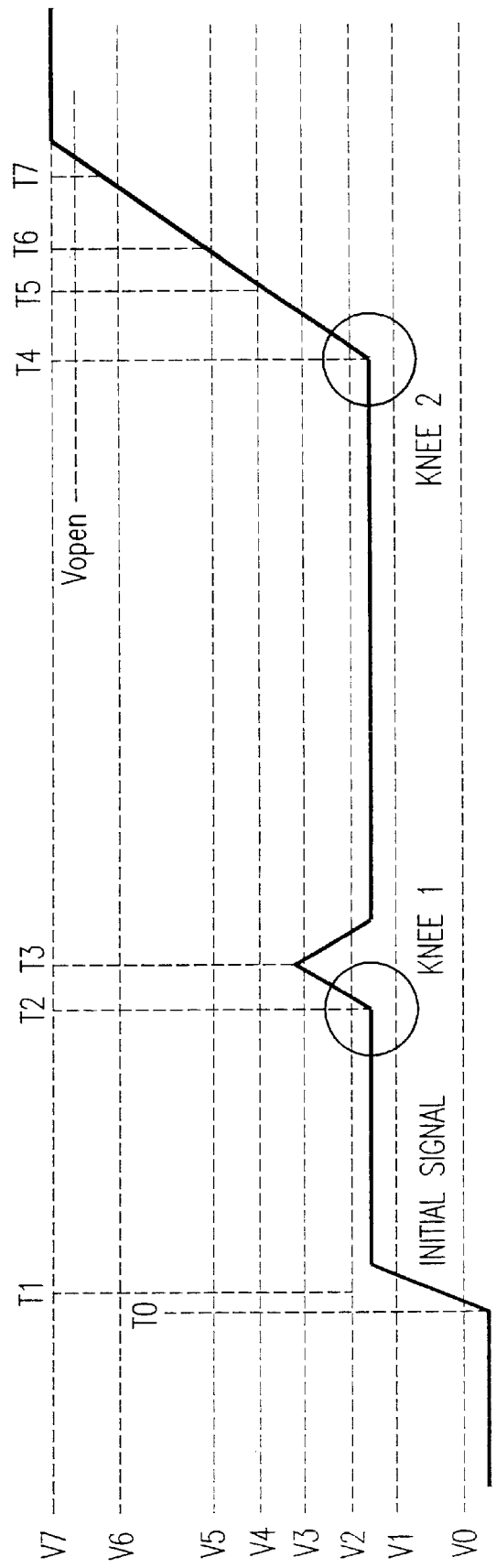
FIG. 11 illustrates the application of further algorithms for performing time domain reflectometry in accordance with the principles of the invention.

For example, using the waveform in FIG. 11, first establish a minimum starting voltage V2 (the process is described in the algorithm section of this disclosure), and make a measurement at a voltage one step smaller (V1). This time may be regarded as the minimum time value for valid measurements and is called Tmin. Various techniques for reducing or eliminating this initial time reading exist, and are not relevant for this disclosure. Then start making measurements at increasing voltages, comparing the delta time and delta voltage readings. For the measurement at V2, the time delta (T2–T1) is much larger than the voltage delta (V2–V1), making the slope smaller than 0.5. This does not qualify as a possible knee. The next measurement, at V3, has a time delta of T3–T2 that is approximately the same as its voltage delta of V3–V2. This slope is greater than ½ and thus qualifies as a possible knee. We now increase the voltage by the required 4% to reach V5 and make a measurement that gets T6 as a result. This slope of (V5–V3)/(T6–T3) is smaller than the required 0.16 and thus disqualifies this location in the waveform from being a valid knee. The next measurement, at V4, along with its deltas of V4–V3 and T5–T3 do not qualify as the start of a possible knee. However, the next measurement, at V5, now has deltas of V5–V4 and T6–T5, which qualify as the start of a possible knee. We increase the voltage by the required 4% to reach V6 and make a measurement that gets T7 as a result. This slope of (V6–V5)/(T7–T6) is higher than the required 0.16, thus all 3 of the conditions are met, and this location is declared a valid knee.

Figure 9:
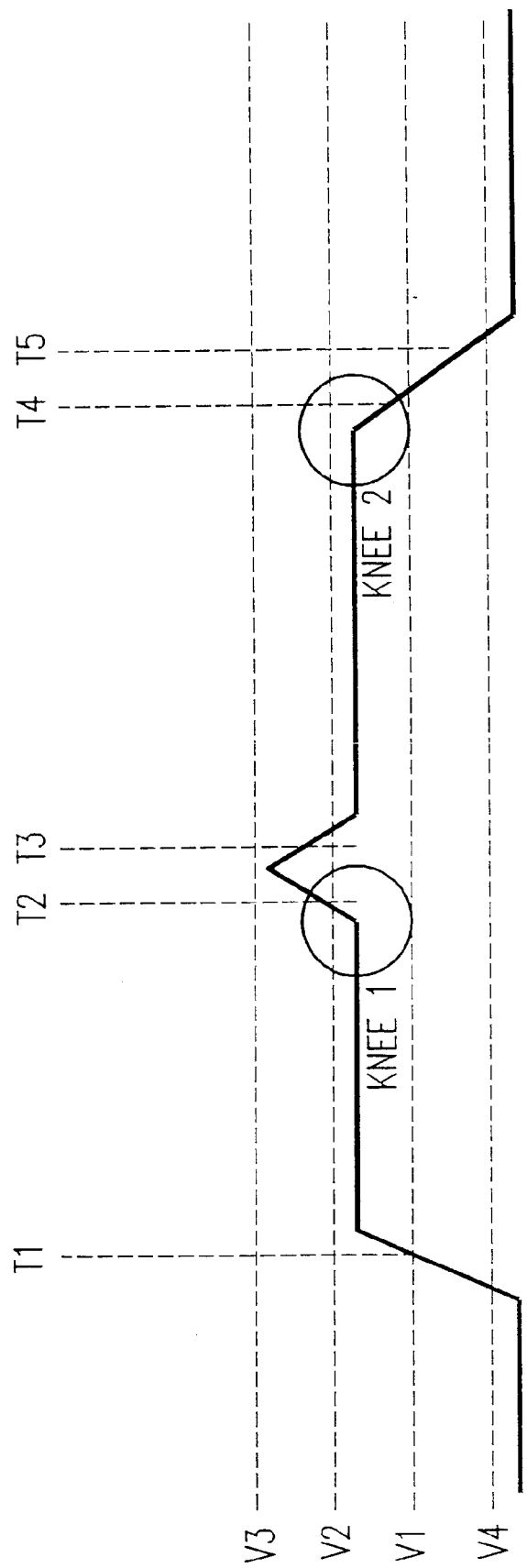
FIG. 9 shows an alternative electrical signal that might be observed from the circuit depicted in FIG. 7.
Figure 10:
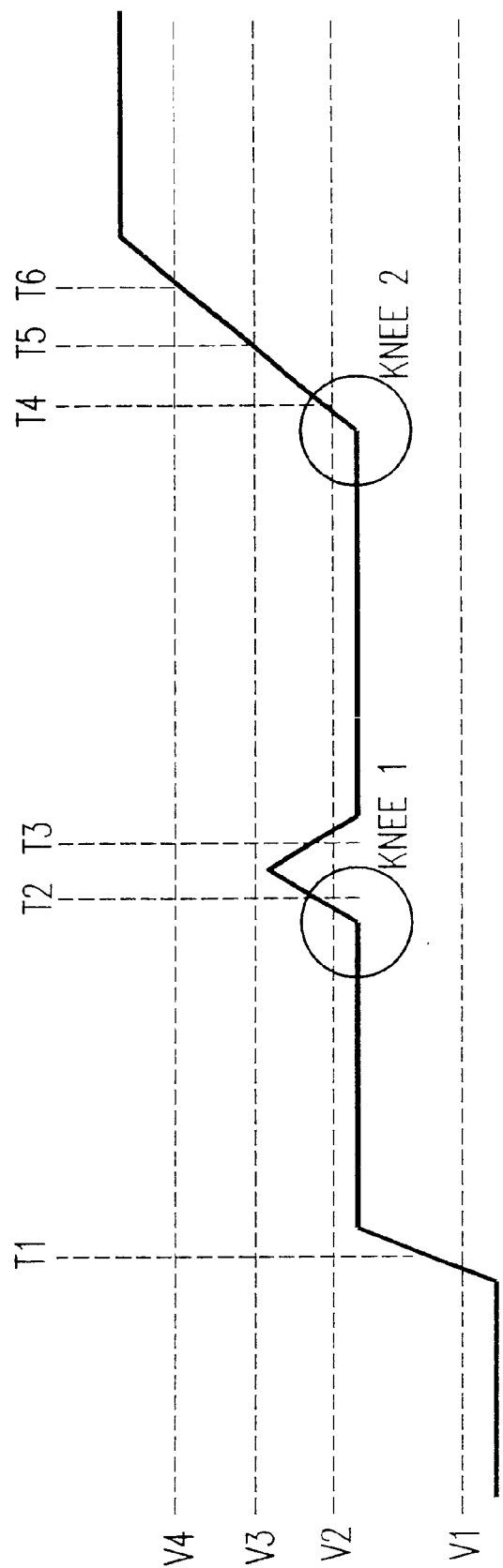
FIG. 10 illustrates the application of an algorithm for performing time domain reflectometry in accordance with the principles of the invention.

Note that if the cable is shorted (FIG. 9), the process is the same, except that the negative crossing direction is selected for the comparator.

The detailed algorithmic process followed in the exemplary implementation contains two parts. The first is to identify the real fault from within the many groups of possible fault data in a TDR measurement. The second is to analyze that fault data to determine the actual distance to the fault. Using the device of FIG. 7, the process for identifying the real fault would be:

1. Determine if the cable is OPEN or NOT OPEN as follows:
    A. Set the selected voltage (VSEL) to the highest possible expected value for an open cable (Vopen) and set the direction of crossing (CD) to detect a transition from below that voltage to above that voltage (positive).
    B. Measure the time from the start of the initial signal to the specified crossing (CT). If that time is not within the limits of the hardware system (CT>Tmax), then the cable is either too long to be measured by this system, or it is NOT OPEN at its far end. For purposes of this discussion, we will ignore cables that are too long to be measured by this particular example system.
    C. If the cable is thus determined to be OPEN, then keep the CD as positive, and begin a search for the appropriate positive edge (step 2). If the cable is determined to be NOT OPEN, then change the CD to be negative and begin the search for the appropriate negative edge (step 3).
2. If OPEN, search for the positive edge as follows:
    A. Starting the voltage selection (VSEL) at its lowest value (V0), measure CT. If CT<=Tmin, increase VSEL by a step size (Vstep) and re-measure. Continue this process until CT>Tmin. At this point, the voltage VSEL is just above the starting point of the TDR waveform. Save this CT as PRIOR_CT. There are other, more efficient ways to search for this starting point, such as a binary search, but such search processes are commonly available and are not specific to this invention. The step size Vstep may not be the minimum available increment, as this algorithm can locate valid knees with relatively large voltage steps (1/128 of Vupper), and fewer measurements will be needed.
    B. Once again increase VSEL by a Vstep and re-measure for CT. If the slope (Vstep/(CT-PRIOR_CT)) is less than 0.5, then this is not the start of a possible knee. Save CT as PRIOR_CT and repeat this step until the knee is located, or some system limit such as maximum voltage or maximum time is reached. If, however, the slope is greater than 0.5, then this is the start of a possible knee, and it must now be validated. Save VSEL as Vstart for later use.
    C. Increase VSEL by 4% of the initial electrical signal (Vupper) and measure CT. If this slope (0.04*Vupper/(CT-PRIOR_CT)) is less than 0.16 then this is not a valid knee. Restore VSEL to the last voltage used in step 2B and return to step 2B. If the slope is greater than 0.16, then this is a valid knee. Save the readings, and proceed to the knee interpolation algorithm.

3. If NOT OPEN, search for the negative edge as follows:
   A. Start VSEL at a voltage one Vstep below Vopen and measure CT. If CT is greater than Tmax or less than Tmin, then this voltage is not on a negative slope. Reduce VSEL by Vstep and re-measure until CT is within the limits of Tmin and Tmax. There are other, more efficient ways to search for this starting point, such as a binary search, but such search processes are commonly available and are not specific to this invention.
   B. Once again decrease VSEL by a Vstep and re-measure for CT. If the slope (Vstep/(CT-PRIOR_CT)) is less than 0.5, then this is not the start of a possible knee. Save CT as PRIOR_CT and repeat this step until the knee is located, or some system limit such as minimum voltage or maximum time is reached. If, however, the slope is greater than 0.5, then this is the start of a possible knee, and it must now be validated. Save VSEL as Vstart for later use.
   C. Decrease VSEL by 4% of the initial electrical signal (Vupper) and measure CT. If this slope (0.04*Vupper/(CT-PRIOR_CT)) is less than 0.16 then this is not a valid knee. Restore VSEL to the last voltage used in step 3B and return to step 3B. If the slope is greater than 0.16, then this is a valid knee. Save the readings, and proceed to the knee interpolation algorithm.

The process to analyze that fault data to determine the actual distance to the fault would be:

4. Using the saved start of the knee (Vstart) as VSEL, make several readings either increasing or decreasing VSEL and accumulate several time readings (CT0, CT1, ... CTn). If the cable was previously found to be OPEN, then VSEL should be increased at each step. If the cable was previously found to be NOT OPEN, then decrease VSEL at each step. It is also useful to "back up" the initial value of VSEL to avoid any initialization noise. To "back up", reduce VSEL if the cable was found to be OPEN, else increase it. The incremental voltage used in this step should be as small as is possible. This will improve the resolution of the measurement and thus the accuracy of the time determination. However, any improvement of the voltage setting beyond the time measurement capabilities is pointless and need not be done. In this implementation, we use 1/256 as the incremental "SmallStep". Any number of readings may be taken in this part of the process but it is advantageous to take as few as possible. In our implementation, we "back up" the initial VSEL by 2 SmallSteps and take 15 such readings at voltage increments of SmallStep (CT0 through CT14).

5. Now analyze the 15 readings. Based on an initial examination of the readings, one of several analysis methods is used. All methods, however, need to examine for and remove any readings that are the result of the "back up" or noise. Additionally, the hardware system has some minimum increment of time measurement below which the time reading is zero. We define the maximum slope condition as when the delta time readings for any two voltage settings is zero.

a. Sharp Slope:
      The slope always degrades (gets smaller) as the measurement gets farther from the knee. So, if the slope at the farthest from the knee of these 15 measurement points is the maximum slope detectable by the system, then this is a sharp slope knee. We determine this end slope by checking the slope over the last few (in our first implementation, the last 3) measurements. If this slope is greater than or equal to the max slope (all 3 readings are the same), then we declare "sharp slope" and declare that the length is equal to the measured value as used for this slope calculation. This method also ignores any "back up" or noise readings that are in the beginning of the 15 measurement list.
   b. Nominal Slope:
      If the measurement list does not qualify as a "sharp slope", then the values are examined to find the beginning of a "sloped portion" that follows an initial "flat portion". The distinguishing characteristic of the "sloped portion" is the size of the delta between two measurements as a function of the value of the first measurement. The table used in the first implementation is representative and may be varied slightly without changing the concept of the invention. The numerical values relate to counts of our system clock of 15 ns each. For simplicity, the delta is taken over a set of 4 readings, and the size of the required delta is multiplied by 4. This also smooths out any minor noise variations. This table is:

| First Value | Required Delta |
| --- | --- |
| 96 | 1/4 |
| 160 | 2/4 |
| 192 | 3/4 |
| 224 | 4/4 | so, if the first value is below 96, use a required delta of 1/4. If above 96 but below 160, use a required delta of 2/4, etc. Start at the first reading in the set of 15 readings, and calculate the delta over the next 4 readings. If that delta is less than the required delta, then this is the valid start of a valid knee (now called the "start region"), and the first of the readings in this set of 4 is declared the length to that knee. If not, move on to the next reading in the set of 15 readings and re-test for the required delta until a successful start is found, or until there are no more readings. If we run out of readings, then this cable has a shallow slope, and the analysis goes to step 5C.

C. Shallow Slope:
      We must test for the nominal slope prior to checking for shallow slope, since most cables with a nominal slope ALSO have a shallow slope section later in the cable. To find the shallow slope, we start with the required delta from the table and increase its value by 1 unit and re-test the entire 15 reading set to look for a start of knee as in test 5B. If a start region is not found, increase the required delta again and re-test. This sequential examination method allows for very shallow cables to be measured, without missing the sharper slope that might be present earlier in the cable and represent a true knee.

6. Now make an adjustment for the resolution of the individual readings and the presence of any earlier 'bumps' that may have masked the true start of the knee. If:
   1. The actual delta over the start region was larger than 8 (4*2), AND
   2. The delta for the first 2 readings of the start region is larger than 1, AND
   3. The delta from the first reading of the start region to the reading immediately prior is more than twice the delta of the first 2 readings, THEN
      subtract ½ the delta of the first 2 readings from the first reading of this start region to get the true start of the knee.

This step is taken to adjust for the likelihood that the selected voltage that has been determined to be at the start of the knee is actually higher than that start due to the granularity of the voltage selection technique. While for steep slopes, the difference between the real start and the measured start is less than 1 unit of time measurement, for nominal and shallow slopes, the difference can be up to the size of the required delta. We use ½ the delta as the adjustment factor. This very same process adjusts for real starts that are hidden behind earlier bumps (see FIG. 8).

Other enhancements of the invention would include reducing the overall time required to conclude the test by reducing of the number of measurements in the areas of the waveform that do not contain interesting data. This is done by using large step sizes and binary search techniques in the search for a valid knee and only changing to small step sizes in the final knee analysis.

APPENDIX A

Appendix A hereto provides (1) a schematic diagram illustrating circuitry suitable for practicing the invention as described herein; and (2) a computer software listing showing a preferred embodiment of computer software for practicing the invention as described herein. Compact discs containing a copy of the computer software for practicing the invention have been submitted as part of the record of this present application.

What is claimed is:

1. A method for determining a position of a location of interest in an elongate electrical conductor, the method comprising:
   applying a predetermined initial electrical signal to the electrical conductor at a selected location to produce a reflected signal in the electrical conductor;
   selecting a plurality of predetermined voltage values;
   monitoring the reflected signal;
   storing a plurality of time values, each said time value representing a time at which the voltage of the reflected signal crosses a corresponding predetermined voltage value; and
   computing a time of propagation of the initial signal from the selected application location to the location of interest in the electrical conductor based on at least one of said stored time values.

2. The method of claim 1, and further comprising:
   determining the distance from the selected application location to the location of interest based on the time of propagation and a speed of propagation of the electrical signal in the electrical conductor.

3. A method for determining a position of a location of interest in an elongate electrical conductor, the method comprising:
   applying a predetermined initial electrical signal to the electrical conductor at a selected location to produce a reflected signal in the electrical conductor;
   selecting an initial predetermined voltage value;
   comparing a voltage of the reflected signal to the predetermined voltage value to determine when the voltage of the reflected signal has crossed the predetermined voltage value;
   storing a first time value, the first time value representing the time at which the voltage of the reflected signal crossed the initial predetermined voltage value;
   changing the voltage value to a modified voltage value;
   comparing the voltage of the reflected signal to the modified voltage value to determine when the voltage of the reflected signal has crossed the modified voltage value;
   storing a second time value, the second time value representing the time at which the voltage of the reflected signal crossed the modified voltage value; and
   determining a time of propagation of the initial signal from the selected application location to the location of interest in the electrical conductor based on said first and second stored time values.

4. The method of claim 3, and further comprising:
   determining the distance from the selected application location to the location of interest based on the time of propagation.

5. The method of claim 3, and further comprising:
   repeating the steps of:
      comparing the voltage of the reflected signal to a voltage value;
      storing a time value representing the time at which the voltage of the reflected signal crossed the voltage value; and
      modifying the voltage value to store a plurality of time values representing when the reflected signal crossed a plurality of voltage values.

6. The method of claim 5, and further comprising:
   determining the distance from the selected application location to the location of interest based at least in part on the plurality of stored time values and a speed of propagation of the electrical signal in the electrical conductor.

7. The method of claim 3, and further comprising:
   determining a time representative of a suspected knee region in the reflected electrical signal, the suspected knee region representing a change in the time rate of change of the voltage of the reflected electrical signal, the suspected knee region further representing a suspected position of the location of interest in the electrical conductor.

8. The method of claim 7, and further comprising:
   confirming the presence of a true knee at the suspected knee region, the true knee representing a true position of the location of interest in the electrical conductor.

9. The method of claim 8, wherein confirming the presence of the true knee at the suspected knee region includes:
   determining a time rate of change of the voltage of the reflected electrical signal in the suspected knee region; and
   comparing the time rate of change of the voltage of the reflected electrical signal in the suspected knee region to a preselected rate criterion representative of a true knee.

10. The method of claim 8, wherein confirming the presence of the true knee at the suspected knee region includes:

calculating a comparison value, said comparison value calculated by subtracting a first voltage associated with a first stored time value from a second voltage associated with a second stored time value, then dividing the result by a voltage of the predetermined initial electrical signal, then dividing that result by the ratio of the difference between the first and second stored time values and the time between the application of the predetermined initial electrical signal and one of the first and second stored time values; and comparing the calculated comparison value to a preselected value indicative of a true knee.

11. The method of claim 8, wherein confirming the presence of the true knee at the suspected knee region includes:

determining a ratio of the difference between a first voltage associated with a first stored time value and a second voltage associated with a second stored time value, and a voltage of the predetermined initial electrical signal; and comparing the determined ratio to a preselected value indicative of a true knee.

12. The method of claim 8, and wherein confirming the presence of the true knee at the suspected knee region further comprises:

determining an average time rate of change of the voltage of the reflected signal over a period including an extended time outside the suspected knee region; and comparing the average time rate of change of the voltage of the reflected signal over the period including the extended time outside the suspected knee region with a preselected criterion selected to confirm the presence of a true knee within the suspected knee region.

13. The method of claim 10, and wherein confirming the presence of the true knee at the suspected knee region further comprises:

calculating an extended comparison value, said extended comparison value calculated by subtracting a voltage associated with a time value within the suspected knee region from a voltage associated with a time value outside of the suspected knee region, then dividing the result by the voltage of the predetermined initial electrical signal, then dividing that result by the ratio of the difference between the time value within the suspected knee region and the time value outside of the suspected knee region and the time between the application of the predetermined initial electrical signal and the time value within the suspected knee region; and comparing the extended comparison value with a preselected extended comparison criterion selected to confirm the presence of a true knee within the suspected knee region.

14. The method of claim 7, and further comprising:

determining the presence of a true knee within the suspected knee region; and determining the location of the true knee within the suspected knee region, wherein determining the location of the true knee includes:

selecting a plurality of voltage values based at least in part on a voltage of the reflected signal within the suspected knee region;

comparing the voltage of the reflected signal within the suspected knee region with the plurality of selected voltage values;

storing a plurality of time values, each said stored time value determined based on a comparison of the voltage of the reflected signal within the suspected knee region with a selected voltage value; and determining the location of the true knee within the suspected knee region based at least in part on at least two of said stored time values.

15. A time domain reflectometry apparatus for determining the location of a region of interest in an electrical conductor having a measurement point, the apparatus including:

a process controller;

a pulse generator electrically coupled to the process controller and adapted to be electrically coupled to the electrical conductor at the measurement point;

a voltage selector having a voltage selector input electrically coupled to the process controller and a voltage selector output;

a comparator having a first comparator input electrically coupled to the voltage selector output, a second comparator input adapted to be electrically coupled to the electrical conductor at the measurement point, and a comparator output;

a polarity selector having a first polarity selector unput electrically couple to the process controller, a second polarity selector input electrically coupled to the comparator output, and a polarity selector output; and a timer having a start input electrically coupled to the process controller, a stop input electrically coupled to the polarity selector output, and a timer output electrically coupled to the process controller.

16. The time domain reflectometry apparatus of claim 15, wherein the process controller is adapted to prompt the pulse generator to generate an electrical signal to be propagated down the electrical conductor.

17. The time domain reflectometry apparatus of claim 15, wherein the process controller selects a predetermined voltage value to be output from the voltage selector output.

18. The time domain reflectometry apparatus of claim 17, wherein the comparator is adapted to output a positive comparator output voltage if a voltage measured at the measurement point of the electrical conductor is greater than the predetermined voltage value output from the voltage selector output.

19. The time domain reflectometry apparatus of claim 15, wherein the polarity selector is an exclusive OR gate.

20. The time domain reflectometry apparatus of claim 19, wherein the polarity selector outputs a logic level high voltage if a voltage at the first polarity selector input is logic level high or if a voltage at the second polarity selector input is logic level high, and the polarity selector outputs a logic level low voltage if the voltage at the first and second polarity selector inputs is both logic level low or both logic level high.

21. The time domain reflectometry apparatus of claim 15, wherein the timer is stopped when the polarity selector outputs a logic level high voltage.

* * * * *

UNITED STATES PATENT AND TRADEMARK OFFICE
CERTIFICATE OF CORRECTION

PATENT NO. : 6,509,740 B1
DATED : January 21, 2003
INVENTOR(S) : Dave Needle and Stan F. Shepard It is certified that error appears in the above-identified patent and that said Letters Patent is hereby corrected as shown below:

Column 3,
Line 46, insert -- Several algorithms are provided for determining a region in which it is suspected that the location of interest may lie, for confirming the presence of the location of interest within that region, and for refining the determined position of the location of interest within the electrial conductor. --

Column 8,
Line 40, delete "so" insert -- So --

Column 10,
Line 22, delete "based on" insert -- based at least in part on --

Column 12,
Line 28, delete "unput" insert -- input --
Line 29, delete "couple" insert -- coupled --

Signed and Sealed this

Fifteenth Day of July, 2003

JAMES E. ROGAN
*Director of the United States Patent and Trademark Office*